(12) United States Patent
Brewster et al.

(10) Patent No.: US 12,520,434 B2
(45) Date of Patent: Jan. 6, 2026

(54) EXTENDED PAD AREA TO PREVENT PRINTED CIRCUIT BOARD DAMAGE

(71) Applicant: Kollmorgen Corporation, Radford, VA (US)

(72) Inventors: Jeffery Todd Brewster, Dublin, VA (US); William Edward Anderson, IV, Blacksburg, VA (US); Stephen John Funk, Riner, VA (US)

(73) Assignee: Kollmorgen Corporation, Radford, VA (US)

( * ) Notice: Subject to any disclaimer, the term of this patent is extended or adjusted under 35 U.S.C. 154(b) by 197 days.

(21) Appl. No.: 18/240,688

(22) Filed: Aug. 31, 2023

(65) Prior Publication Data

US 2024/0074067 A1 Feb. 29, 2024

Related U.S. Application Data

(60) Provisional application No. 63/402,699, filed on Aug. 31, 2022.

(51) Int. Cl.
*H05K 1/11* (2006.01)
*H05K 3/34* (2006.01)

(52) U.S. Cl.
CPC ............ *H05K 3/341* (2013.01); *H05K 1/111* (2013.01); *H05K 2203/107* (2013.01)

(58) Field of Classification Search
CPC ............ H05K 1/11; H05K 1/111; H05K 2201/09145–0919; H05K 2201/09381;
(Continued)

(56) References Cited

U.S. PATENT DOCUMENTS

| 4,756,696 A | 7/1988 | Whiteman |
| 5,012,502 A | 4/1991 | Battin et al. |

(Continued)

FOREIGN PATENT DOCUMENTS

| CN | 101706458 A | 5/2010 |
| JP | 2006173282 A2 | 6/2006 |

(Continued)

OTHER PUBLICATIONS

Thornwood, "Integrated Test Via and Pad Design", IBM Technical Disclosure Bulletin, International Business Machines Corp., vol. 34, No. 3, Aug. 1, 1991, pp. 361-362, XP000210616.
(Continued)

*Primary Examiner* — Roshn K Varghese
(74) *Attorney, Agent, or Firm* — Day Pitney LLP; George Chaclas; Anthony A. Kassas

(57) ABSTRACT

A printed circuit board having an electrically insulative layer and a conductive solder pad. The conductive solder pad is disposed at least partially over the electrically insulative layer, and defines a solder contact area. The solder contact area is configured for making an electrical connection to an electrical component via laser soldering. The printed circuit board further includes a solder mask coating the conductive solder pad and defining an exposed area of the conductive solder pad. The conductive solder pad protects the electrically insulative layer from incident heat during the laser soldering by extending a length underneath the solder mask along a periphery of the exposed area.

20 Claims, 9 Drawing Sheets

(58) Field of Classification Search
CPC . H05K 2201/0939; H05K 2201/09436; H05K 2201/099; H05K 3/341; H05K 2203/107
See application file for complete search history.

(56) References Cited

U.S. PATENT DOCUMENTS

| | | | |
|---|---|---|---|
| 5,047,714 | A | 9/1991 | Maeno et al. |
| 5,108,024 | A | 4/1992 | Kazem-Goudarzi et al. |
| 5,164,994 | A | 11/1992 | Bushroe |
| 5,446,244 | A | 8/1995 | Kawanabe et al. |
| 5,713,126 | A | 2/1998 | Sakemi |
| 5,917,704 | A | 6/1999 | Trublowski et al. |
| 6,272,204 | B1 | 8/2001 | Amtower et al. |
| 6,479,755 | B1 | 11/2002 | Kim et al. |
| 7,005,750 | B2 | 2/2006 | Liu |
| 7,134,592 | B2 | 11/2006 | Ensslin et al. |
| 7,301,103 | B2 * | 11/2007 | Tanaka ................... H05K 1/116 174/250 |
| 7,416,106 | B1 | 8/2008 | Downes et al. |
| 8,428,339 | B2 | 4/2013 | Wang et al. |
| 9,250,198 | B2 | 2/2016 | Ishigaki |
| 9,814,135 | B2 | 11/2017 | Nakamura |
| 10,772,214 | B2 | 9/2020 | Momose et al. |
| 2006/0124702 | A1 | 6/2006 | Oonishi |
| 2008/0066955 | A1 | 3/2008 | Nodo et al. |
| 2009/0260853 | A1 | 10/2009 | Nagaya et al. |
| 2009/0279272 | A1 | 11/2009 | Sun |
| 2011/0262028 | A1 | 10/2011 | Lipson et al. |
| 2016/0164365 | A1 | 6/2016 | Yoneda et al. |
| 2020/0154577 | A1 * | 5/2020 | Momose ................... B23K 3/08 |

FOREIGN PATENT DOCUMENTS

| | | |
|---|---|---|
| JP | 2014107424 A2 | 6/2014 |
| WO | 2012096004 A1 | 7/2012 |

OTHER PUBLICATIONS

International Search Report and Written Opinion corresponding to Application No. PCT/US2022/050369, dated Apr. 3, 2023, 17 pages.
International Search Report and Written Opinion corresponding to Application No. PCT/US2023/031693, dated Jan. 3, 2024, 12 pages.
IBM Technical Disclosure Bulletin, International business Machines Corp. (Thornwood), "Integrated Test Via and Pad Design", US, vol. 34, No. 3, Aug. 1, 1991, pp. 361-362, XP000210616.
International Preliminary Report on Patentability and Written Opinion corresponding to Application No. PCT/US2023/031693, dated Mar. 13, 2025, 7 pages.

* cited by examiner

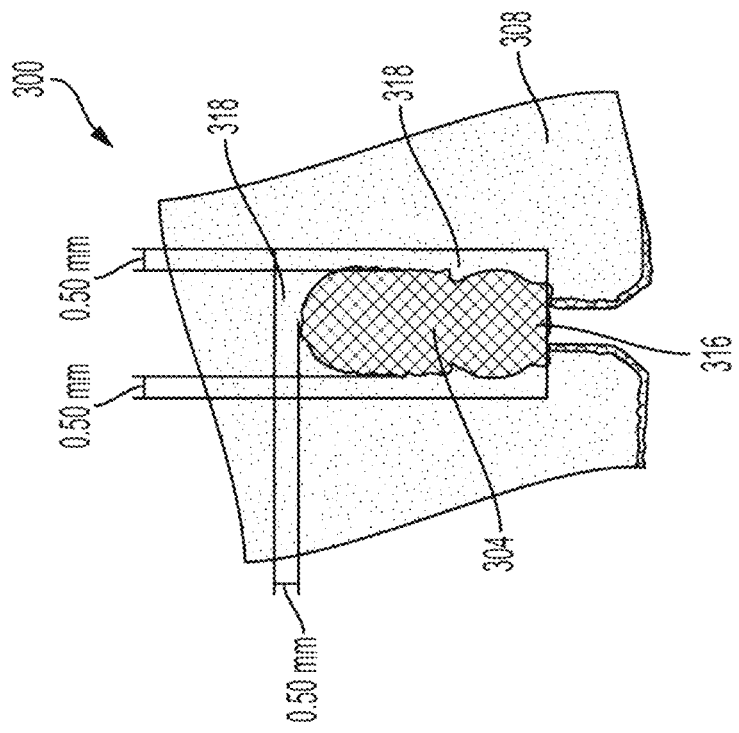
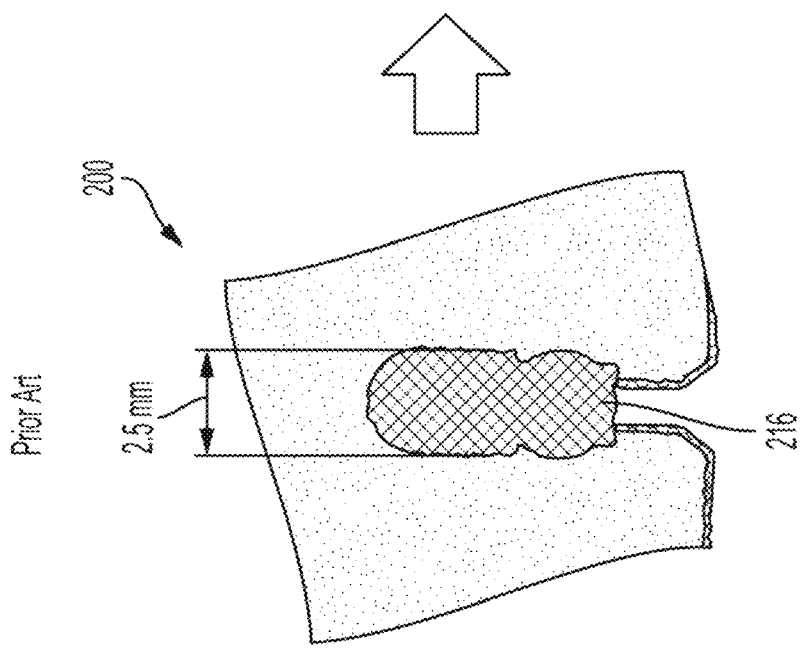
FIG. 5B
FIG. 5A

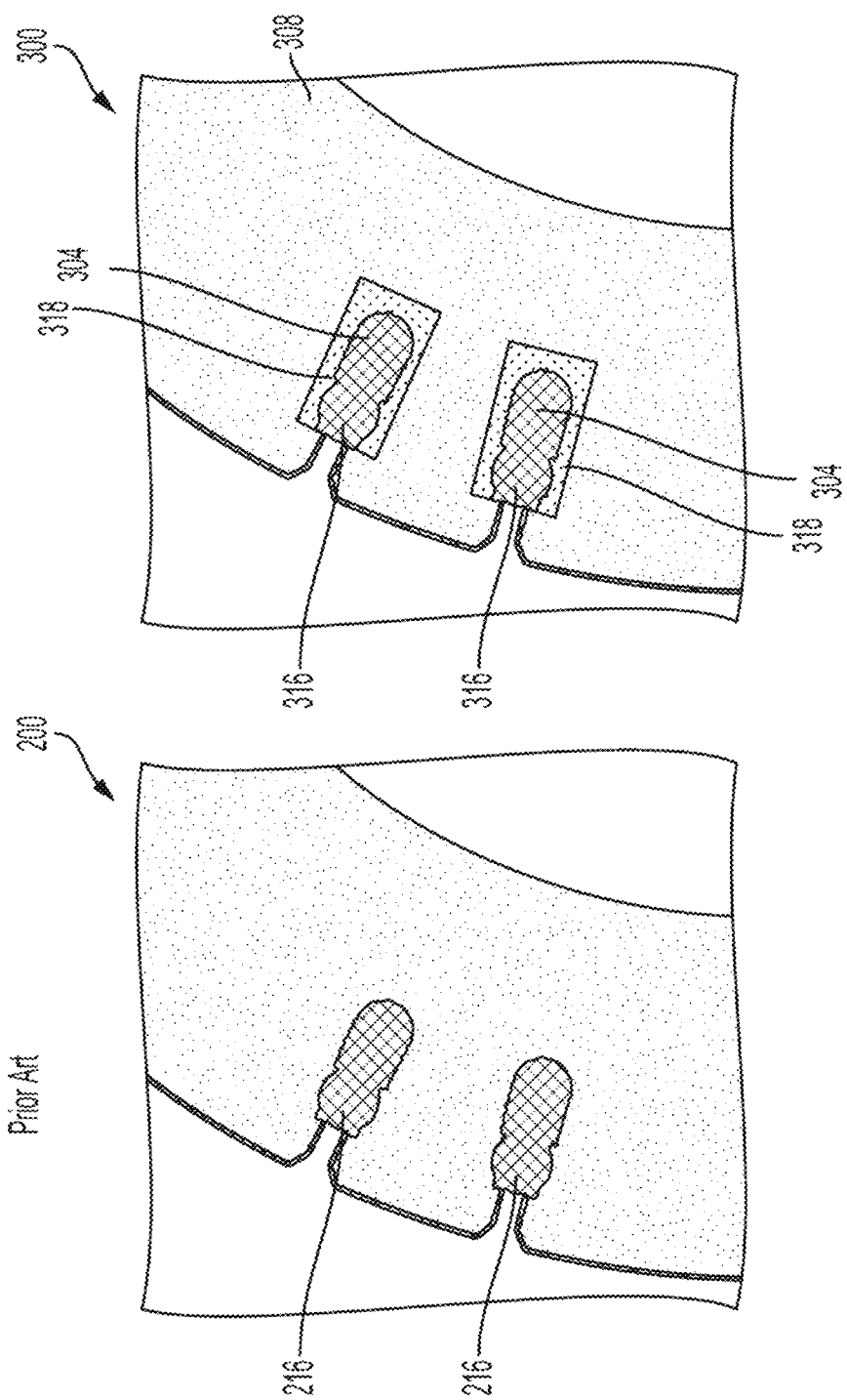

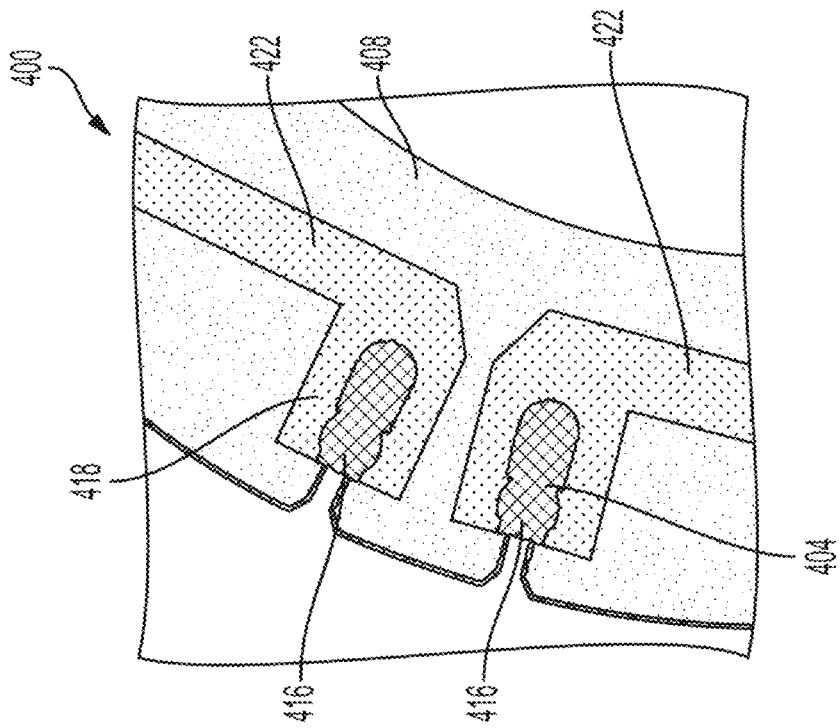
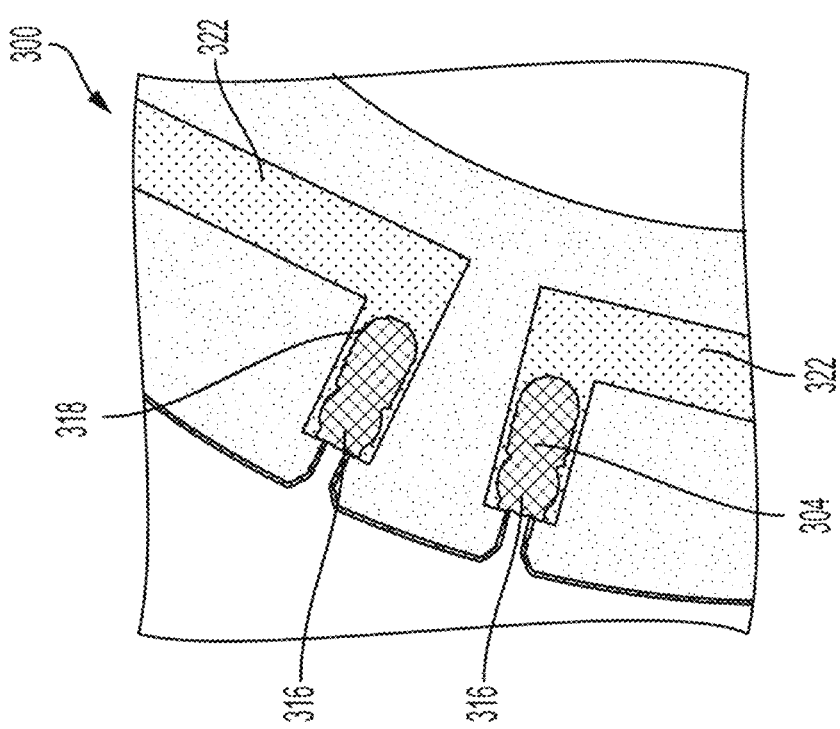

EXTENDED PAD AREA TO PREVENT PRINTED CIRCUIT BOARD DAMAGE

CROSS REFERENCE TO RELATED APPLICATIONS

This application claims the benefit of U.S. Provisional Application No. 63/402,699 filed Aug. 31, 2022 entitled CONNECTION BETWEEN A MOTOR AND A PRINTED CIRCUIT BOARD, the contents of which are incorporated herein by reference in its entirety for any purpose whatsoever.

FIELD OF THE DISCLOSURE

The subject of this disclosure relates to printed circuit boards, and more particularly to solder pads preventing damage to the printed circuit board during laser soldering.

BACKGROUND

A printed circuit board is a multi-layer structured device that makes electrical connections between electronic components. The layers of a printed circuit board may vary, but generally consist of a base material and copper foil laminate that are pressed together and cured with heat to form the core of the printed circuit board. Multiple layers of conductive material are arranged alternately with electrically insulative layers. The metallic layers of the printed circuit board can be etched to form electrical traces that construct an electrical circuit. Multiple conductive layers can also be connected to each other by vias. The top metal layer in a printed circuit board is coated with a solder mask layer. The solder mask layer defines the perimeter of the solder pad i.e., the area of the metal that is exposed and available to make electric connections.

Laser soldering is a process used to make the electrical connections to the solder pads on a printed circuit board. Solder pads are usually designed with specific dimensions and shapes to match the corresponding leads of the components they're meant to accommodate. The size and shape of the solder pad can affect the soldering process, heat distribution, and the overall mechanical and electrical performance of the connection. A known problem with laser soldering is the potential for laser damage to the material adjacent to the solder pad due to laser misalignment. This scorching occurs because the printed circuit board composite material cannot withstand the intense localized heating if struck directly by the laser. Laser light may also reflect off of solder material onto the printed circuit board and is another potential heat source that could cause damage and requires mitigation. Excessive heat may cause the printed circuit board to delaminate or destroy the necessary insulative properties of the composite. If the insulation between two metal layers breaks down, the electrical circuit is destroyed, and device failure results.

Protecting a printed circuit board from damage due to laser soldering is a known challenge within the electronics industry. Several disclosures exist to address this problem. In one such disclosure (U.S. Pat. No. 10,772,214 B2), a pin is inserted in a through-hole of a solder contact and welded in place. A white coating on the solder contact reflects the laser beam and the angle of the laser beam is adjusted so that the rate of energy absorption is decreased and damage to an insulated part is restrained. An irradiation angle of the laser beam for welding with respect to the circuit board is adjusted so that the laser light reflected off the terminal pin strikes the white layer on the solder contact. Reflecting off the white coating on the board and adjusting laser angle prevents excessive heating of the insulating element.

In U.S. Pat. No. 7,134,592 B2, temperature-sensitive electronic components that are connected to a board by soldering during the installation process are protected from the heat during the soldering process in order to prevent permanent damage to the components. The solder connections of the component are thermally coupled to a protection apparatus during the soldering process, so that some of the heat that is introduced into the solder connections during the soldering process is passed to the protection apparatus. The protection apparatus also has a protection sleeve, which surrounds the component in places. The protection sleeve is composed of a thermally insulated material and is provided with a coating with a high thermal reflection capability in places on its outer wall which faces away from the component.

In Japanese Patent No. 2014107424A, the shape of the leading part of a terminal of an electronic component is configured to prevent the occurrence of burning of the surface of a circuit board, resulting from fusion of a solder by a laser beam. In an electronic circuit device including a circuit board on which electronic components are mounted, the terminal of an electronic component inserted in a through-hole is joined to a solder contact on the circuit board via a solder fused by a laser beam emitted from a laser light source. The shape of the leading end part of the terminal of an electronic component and the exposed margin of the terminal are set so that direct light from the laser light source and light reflected by the leading end part of the terminal do not overlap on the surface of the circuit board other than on the solder contact.

In Japanese Patent No. 2006173282A, a method is devised to provide an electronic part soldering and a device having a simple configuration, through which a substrate can be protected against burning. The soldering method is one of soldering the lead of an electronic part to the solder contacts of the printed board by irradiation with a laser beam. In the method, a light shading member equipped with a cylinder whose internal circumference is nearly equal to the external circumference of the solder contact in the plane direction of the solder contact forming surface of the printed board is arranged on the surface of a base by making its one opening end bear against the surface, so as to include the insertion tip of the lead and the land in its opening region to prevent the surface of the base of the printed board around the land from being irradiated directly and/or indirectly with the laser beam (reflected beam), and the lead is irradiated with the laser beam through the cylinder.

SUMMARY

Laser soldering is a precision soldering technique that uses a laser beam to heat and melt solder material, joining two or more components together such as a conductive wire to a contact pad. Therein, a focused laser beam is directed onto a solder joint, providing localized and controlled heating. The energy from the laser beam is absorbed by the solder material which causes the solder material to melt. After cooling, a strong bond is formed between the parts being soldered. Solder pads are necessary to provide a means to protect the composite layer structure of a printed circuit board from damage. An improved design for solder pads on a printed circuit board is discussed herein, and accomplishes the goal of protecting composite layer structures more effectively and efficiently than existing solutions in the industry.

An embodiment of the present disclosure includes a printed circuit board. The printed circuit board has an electrically insulative layer and a conductive solder pad disposed at least partially over the electrically insulative layer. The conductive solder pad defines a solder contact area configured for making an electrical connection to an electrical component via laser soldering. The printed circuit board further includes a solder mask coating the conductive solder pad and defining an exposed area of the conductive solder pad. The conductive solder pad protects the electrically insulative layer from incident heat during the laser soldering by extending a length underneath the solder mask along a periphery of the exposed area.

In another embodiment, the length of extension of the conductive solder pad may be dependent on a height and width of the solder contact area or on a minimum angle of reflection, accounting for laser reflection outside of the solder contact area during laser soldering. Yet still, the length of extension of the conductive solder pad may be further dependent on a maximum angle of reflection, comprising the minimum angle of reflection and a supplemental angle of reflection accounting for part tolerances, conductor placement and/or variations during laser soldering. The angle of reflection accounting for part tolerances, conductor placement and/or variations during laser soldering may range between 5 to 30 degrees. The range provides a balance between a minimum amount of protection and a maximum amount of protection before the solder pad becomes a large enough heat sink to deteriorate the quality of the resulting solder joint. In another embodiment, the range is 10 to 25 degrees.

The length of extension of the conductive solder pad may be determined by the following equation:

$$W_{ep} = H_c * \tan\{\theta_{sa} + \phi\} - \frac{W_{sa}}{2} + \frac{W_c}{2}$$

wherein:
$W_{ep}$ is the length of extension of the conductive solder pad;
$H_c$ and $W_c$ are a height and width, respectively, of the solder contact area of the conductive solder pad;
$\theta_{sa}$ is a minimum angle of reflection, accounting for laser reflection outside of the solder contact area during laser soldering;
$\phi$ is a supplemental angle of reflection accounting for part tolerances, conductor placement and/or variations during laser soldering; and
$W_{sa}$ is a width of the conductive solder pad.

In an embodiment of the present disclosure the conductive solder pad may be fully disposed around the periphery of the solder contact area, providing heat protection in all directions relative to the solder contact area, less a channel in the printed circuit board for receiving a conductive wire. The length of extension of the conductive solder pad may be 0.25-2.5 millimeters.

An embodiment of the present disclosure includes a printed circuit board. The printed circuit board has an insulative layer and a copper pad disposed over the insulative layer, the copper pad defining a solder contact area for soldering components thereto. The printed circuit board also has a solder mask layer disposed over the copper pad. The copper pad extends underneath the solder mask layer to protect the insulative layer during soldering.

In yet another embodiment, the copper pad extends underneath the solder mask layer along a periphery of the solder contact area, or extends underneath the solder mask layer along a periphery of the solder contact area, less a channel in the printed circuit board for receiving a conductive wire.

An embodiment of the present disclosure includes a method of manufacturing a printed circuit board. The method includes situating an electrically insulating base layer and a solder pad adjacent the electrically insulating base layer, the solder pad defining an electrical contact area. The method further includes the step of coating the solder pad with a solder mask such that the solder pad extends underneath the solder mask by a distance, the electrical contact area remaining exposed. Lastly, the method includes the step of laser soldering conductive wire to the electrical contact area, the solder pad protecting the electrically insulating base layer from damage incurred during laser soldering by virtue of extending underneath the solder mask.

BRIEF DESCRIPTION OF THE DRAWINGS

Various aspects of the present disclosure are discussed herein with reference to the accompanying Figures. It will be appreciated that for simplicity and clarity of illustration, elements shown in the drawings have not necessarily been drawn accurately or to scale. For example, the dimensions of some of the elements can be exaggerated relative to other elements for clarity or several physical components can be included in one functional block or element. Further, where considered appropriate, reference numerals can be repeated among the drawings to indicate corresponding or analogous elements. For purposes of clarity, however, not every component can be labeled in every drawing. The Figures are provided for the purposes of illustration and explanation and are not intended as a definition of the limits of the disclosure.

In FIG. 4B, the area of the solder pad extends beyond the area exposed by the solder mask to protect the underlying and adjacent base material. If heat is applied outside the solder area, the extended pad absorbs the heat and the printed circuit board is not damaged.

FIGS. 5A-5B show overhead, plan views of a 2.5 mm wide solder contact. By increasing the size of the solder pad beneath the solder mask to have a protective border region that is 0.50 mm wide, as shown in FIG. 5B, the underlying and adjacent insulative base material is protected from thermal damage due to laser soldering.

FIGS. 7A-7B show overhead, plan views of electrically isolated solder contacts on the top layer of a printed circuit board, FIG. 7A exhibiting a design known in the art, while FIG. 7B exhibits an increased solder pad size beneath the solder mask according to the present disclosure.

FIGS. 8-9 show overhead, plan views of solder pads connected to traces etched into the top metal layer of a printed circuit board accordingly to the subject disclosure.

DETAILED DESCRIPTION

Figure 1:
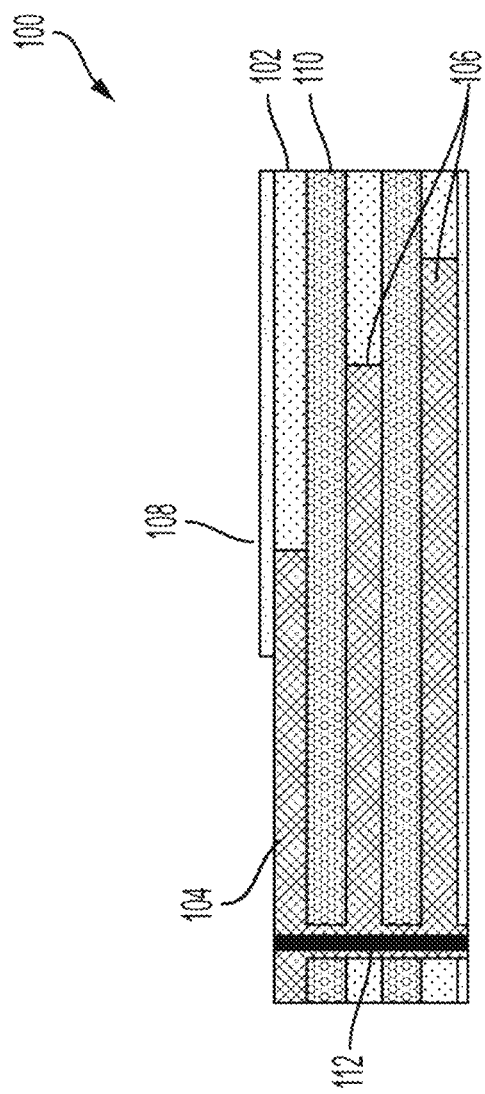
FIG. 1 shows a schematic diagram of a cross-section of a conventional printed circuit board, exhibiting the variable layers therein.

The subject technology overcomes many of the prior art problems associated with printed circuit boards and laser soldering. The advantages, and other features of the technology disclosed herein, will become more readily apparent to those having ordinary skill in the art from the following detailed description of certain exemplary embodiments taken in combination with the drawings and wherein like reference numerals identify similar structural elements. It should be noted that directional indications such as vertical, horizontal, upward, downward, right, left and the like, are used with respect to the figures and not meant in a limiting manner.

A cross-sectional schematic of a printed circuit board 100 is shown in FIG. 1. A printed circuit board 100 is a multi-layer structured device that makes electrical connections between electronic components. The layers of the printed circuit board 100 may vary, but generally consist of a base material 102 and copper foil laminate 104.

The base material 102 consists of a glass substrate upon which a flame-retardant (FR) epoxy resin, such as a resin meeting the requirements of UL94V-0, is deposited and partially cured. The base material 102 is electrically insulative and provides electrical isolation for the successive metal layers that is necessary for the device to function. FR4 is a typical material used to construct the layer 102 of the printed circuit board 100 due to the strength-to-weight ratio, waterproof properties, and manufacturability. This material has a temperature index of 110° C. to 150° C., the maximum service temperature at which the critical properties of a material will remain within acceptable limits over a long period of time. In one embodiment, FR4 is made from a flame retardant epoxy resin and glass fabric composite. Furthermore, FR4 has notable adhesive properties to copper foil and has minimal water absorption.

The printed circuit board 100 also consists of alternating layers of copper foil 106 and insulation 110. During manufacturing, heat is applied to bond the layers 102, 106, 110 together. The copper foil layers 106 are electrochemically etched to define copper traces that conduct electricity and form the electrical circuit of the device, electrically connected together by a via 112.

The top copper surface 104 of the laminate is coated with a patterned solder mask 108 to define areas of copper that are exposed to make electrical connections to the board 100. Solder is used to make the electrical connections between the top copper surface 104, wires (not distinctly shown), and component electrical leads (not distinctly shown).

The top metal layer 104 of the printed circuit board 100 has a solder contact area that is limited in size by the solder mask 108. The area of the solder contact area needs to be large enough so that it contains the exposed length of wire and resulting solder joint. Sufficient heat is required to fully melt the solder without damaging the printed circuit board 102 laminations. If the solder pad is large, more time and heat are required to fully heat the assembly to the desired temperature.

Lasers can be used to impart thermal energy to precisely localized areas in the soldering process. If laser heat is applied to areas adjacent to the solder pad, such as by incident laser light reflecting off of the solder onto the printed circuit board 100, the base material 102 or the insulative layers 110 may be damaged. Excessive heat may cause the printed circuit board 100 to delaminate or destroy the necessary insulative properties of the composite.

For context, solder is a fusible metal alloy with a low melting temperature and low surface tension that is used to bond electrically conductive surfaces in the construction of electrical devices. Solder generally has a range of melting temperatures from 90° C. to 450° C. The composition of the solder alloy determines the melting temperature. Alloys with higher or lower melting temperature can be selected and mixed to achieve optimal properties for manufacturability of electrical connections. A two-phase mixture of a low and high melting temperature alloys may be chosen and prepared with flux that reduces the surface tension of the molten alloy. This mixture may be prepared into a soldering paste or wire depending on the application.

In order to make the electrical connection, two components to be connected are brought into close proximity with solder and the assembly is heated to melt the solder to flow and coat the surfaces of both components. The molten solder is allowed to cool and solidify. In this way, a connection can be made with electrical conductivity. The mechanical and electrical quality of the connection depends upon achieving an appropriate temperature for the assembly. Temperatures in excess of 200° C. are often required to melt solder paste and form high quality connections.

Figure 2A:
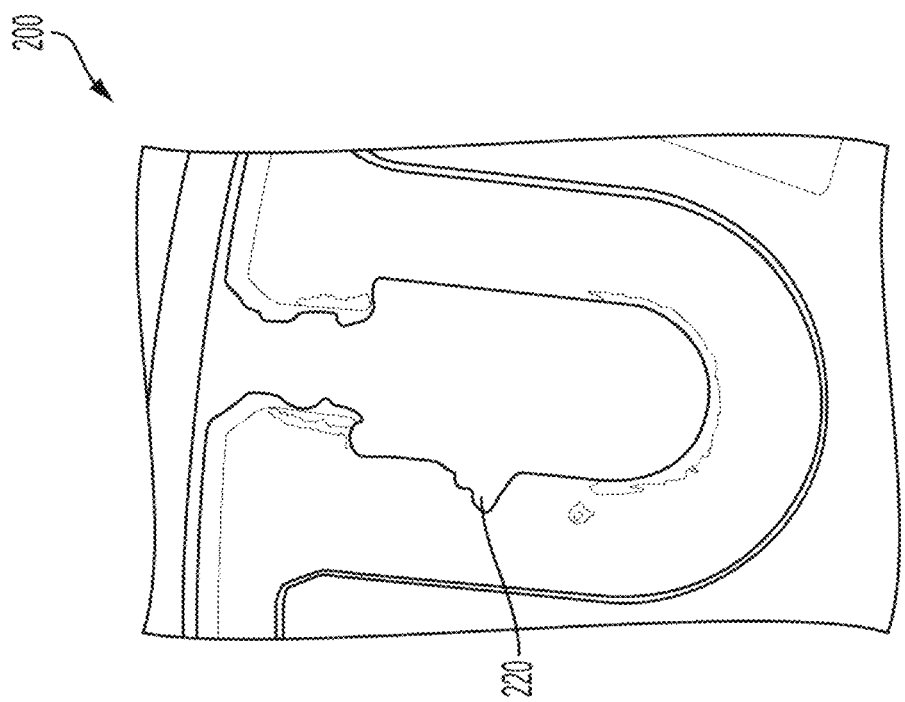
FIGS. 2A-2B show overhead, perspective views of example damage specimens to a printed circuit board incurred during laser soldering. Excessive heat may cause the printed circuit board to delaminate or destroy the necessary insulative properties of the composite. If the insulation between two metal layers breaks down, the electrical circuit is destroyed, and device failure is likely to result.
Figure 2B:
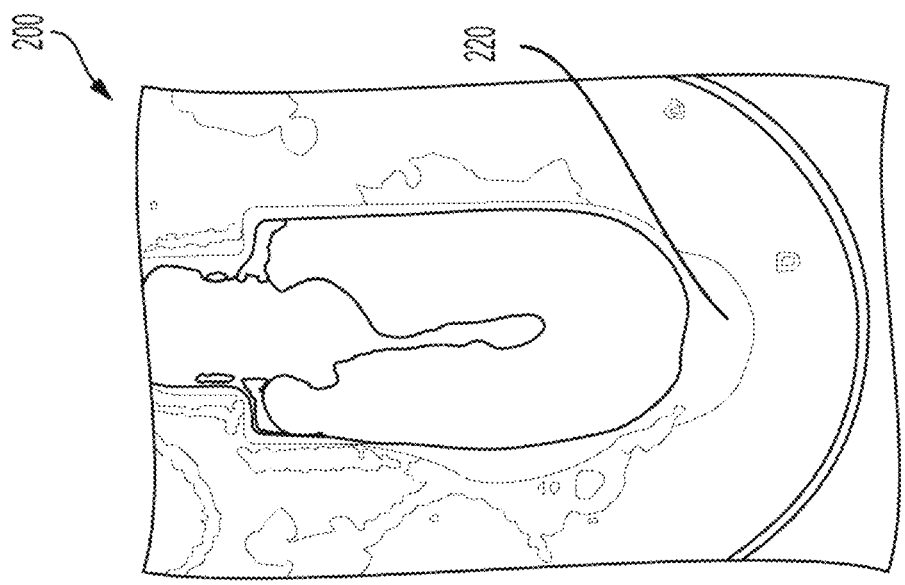

FIGS. 2A-2B show examples of damage 220 to a printed circuit board 200 incurred during laser soldering. As mentioned supra, once the insulation between two metal layers of the printed circuit board 200 breaks down, the electrical circuit is destroyed, and device failure is likely to result.

Figure 3:
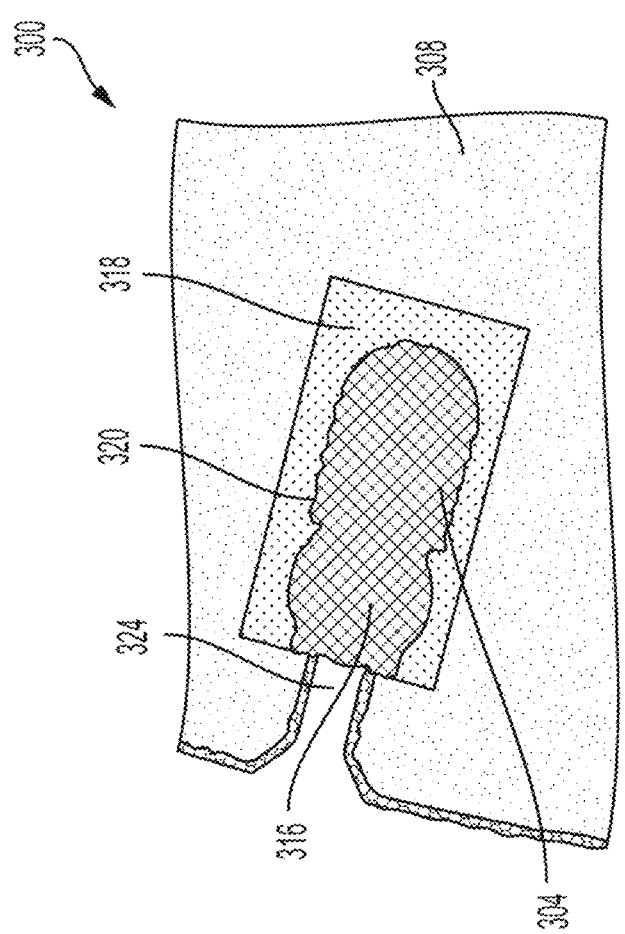
FIG. 3 shows an overhead, plan view of a solder mask defining a solder contact area for soldering wire.

Referring now to FIG. 3, in an aspect of the present disclosure, the solder mask 308 defines a solder contact area 304. Yet, the solder pad 316 extends beyond the contact area 304 exposed by the solder mask 308 to protect the underlying and adjacent base material and adjacent material forming the printed circuit board 300. The extension of the solder pad 316 is referred to herein as a protective border region 318. Preferably, the protective border region 318 is fully disposed around a periphery 319 of the solder contact area 304, providing heat protection in all directions relative to the solder contact area 304, less a channel 324 for receiving a conductive wire for connection to the board 300.

In this embodiment, if heat is applied outside the solder area 304, and onto an edge 320 of the solder mask 308, the pad 316 absorbs the heat by virtue of the pad 316 extending underneath the edge 320 of the solder mask 308. Consequently the layers of the printed circuit board 300 are heat protected. It's worth noting that to facilitate quicker soldering, the amount of copper around the area of the pad 304 defined by the solder mask 308 needs to be minimized, but large enough to provide the protection to the printed circuit board 300 insulative layers. The optimization of such is discussed with reference to FIG. 10 below.

Figure 4B:
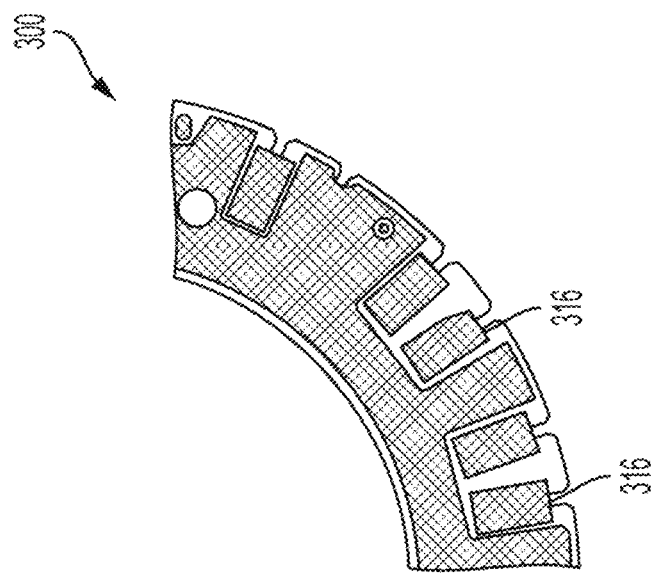
FIGS. 4A-4B show two overhead, plan views for solder pads, comparing a design known in the art in FIG. 4A to the design for the solder pad of the present disclosure in FIG. 4B.
Figure 4A:
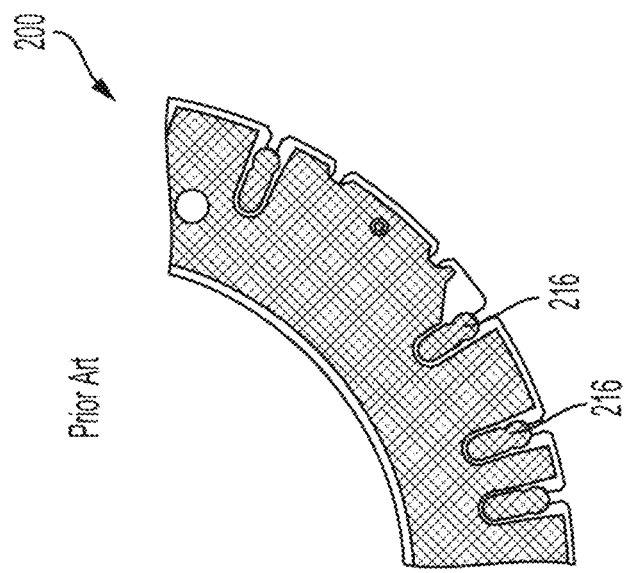

Further to the description of FIG. 3, FIGS. 4A and 4B contrast schematic illustrations of solder pads 216 embedded on a printed circuit board known in the art 200 and solder pads 316 of an improved printed circuit board 300 design. As presented, the pad 316 of the improved printed circuit board 300 extends underneath the edge of the solder mask 308, thus protecting layers of the improved printed circuit board 300 from incident heat during the solder process.

FIG. 5A and FIG. 5B show further example comparisons of the printed circuit board known in the art 200 and the improved printed circuit board 300 designs. The solder pad 216 in FIG. 5A is 2.5 mm wide. By contrast, as shown in FIG. 5B, solder pad 316 has an increased width of 3.5 mm, providing a 0.50 mm lateral extension of solder pad 316 beneath the solder mask 308. Further, the height of the solder pad 316 is increased by 0.50 mm. Accordingly, the protective border region 318 of FIG. 5B is disposed around the periphery of the solder contact area 304 by 0.50 mm in all directions, thus protecting the underlying and adjacent insulative base material (not distinctly shown) from thermal damage due to laser soldering completed within the contact area 304.

Figure 6B:
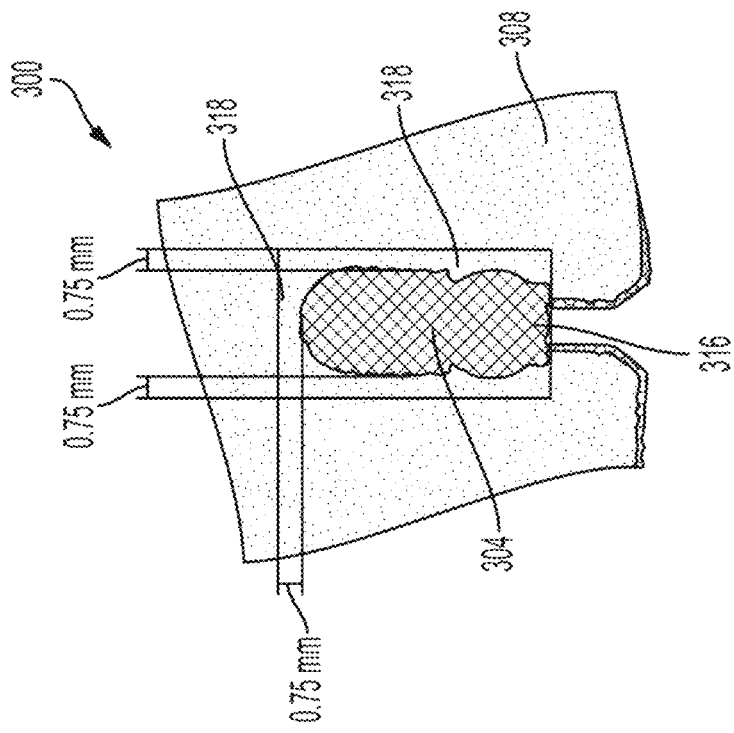
FIGS. 6A-6B show overhead, plan views of a 3.5 mm wide solder contact. By increasing the size of the solder pad beneath the solder mask to have a protective border region that is 0.75 mm wide, as shown in FIG. 6B, the underlying and adjacent insulative base material is protected from thermal damage due to laser soldering.
Figure 6A:
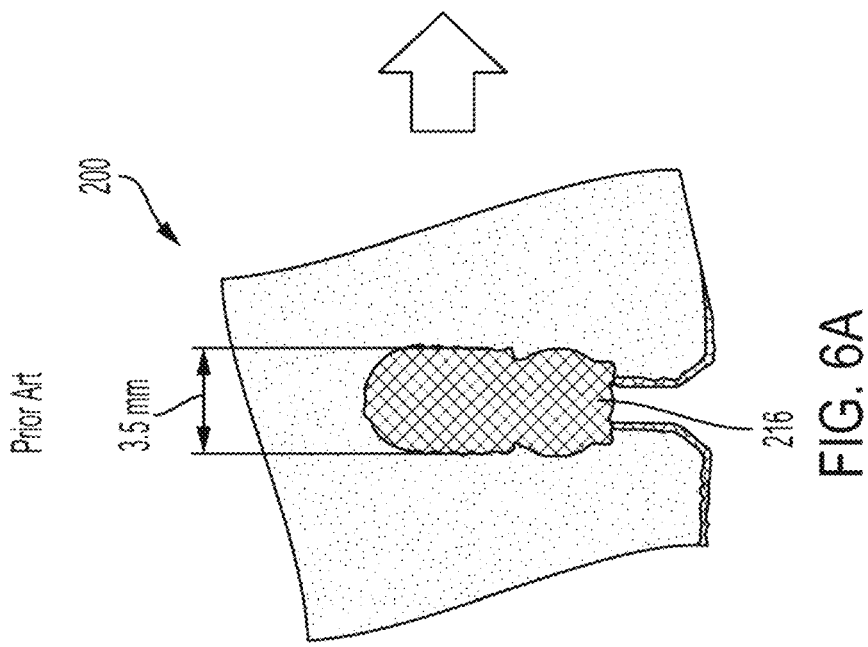

FIG. 6A and FIG. 6B show further example comparisons of the printed circuit board known in the art 200 and improved printed circuit board 300 designs. Here, the solder pad 216 in FIG. 6A is 3.5 mm wide. By contrast, as shown in FIG. 6B, solder pad 316 has an increased width of 5.0 mm, providing a 0.75 mm lateral extension of solder pad 316 beneath the solder mask 308. Further, the height of the solder pad 316 is increased by 0.75 mm. Accordingly, the protective border region 318 of FIG. 6B is disposed around the periphery of the solder contact area 304 by 0.75 mm in all directions, thus protecting the underlying and adjacent insulative base material (not distinctly shown) from thermal damage due to laser soldering completed within the contact area 304.

In FIGS. 5B and 6B, the width of the protective border region 318 is approximately 20% of the width of the solder contact 304. This profile factor is sufficient to provide protection to the underlying and adjacent base material, while not so large so as to add excessive thermal mass to the assembly that would require more heating to form the high-quality electrical connection.

Referring now to FIGS. 7A-7B, the printed circuit board known in the art 200 and improved printed circuit board 300 are further juxtaposed in an embodiment with electrically isolated solder contacts. In this regard, solder contacts 304 on the top layer of the printed circuit board 300 may be electrically isolated on a first metallic layer of the composite structure. These isolated solder pads 316 may be connected to underlying metal layers by vias as shown in FIG. 1. Nonetheless, the principles discussed herein still apply, in that the solder pad 316 of the present disclosure provides a protective border region 318 disposed around the periphery of the solder contact area 304 for thermal protection.

FIGS. 8-9 show different embodiments of improved printed circuit boards 300, 400 having solder pads 316, 416 with protective border regions 318, 418. The solder contacts 304, 404 on the top layer of the printed circuit boards 300, 400 are connected to traces 322, 422 etched into the top metal layer of the printed circuit boards 300, 400. Still, the solder pads 316, 416 provide a protective border region 318, 418 disposed around the periphery of each solder contact area 304, 404 for thermal protection. The illustrations of FIGS. 8-9 further show that in an embodiment of the disclosure, a width of the solder pad 316, 416 may be increased by a protective border 318, 418 width that is on the order of the width of the exposed solder contact area 304, 404 independent of and without modification to the trace 322, 422.

Figure 10:
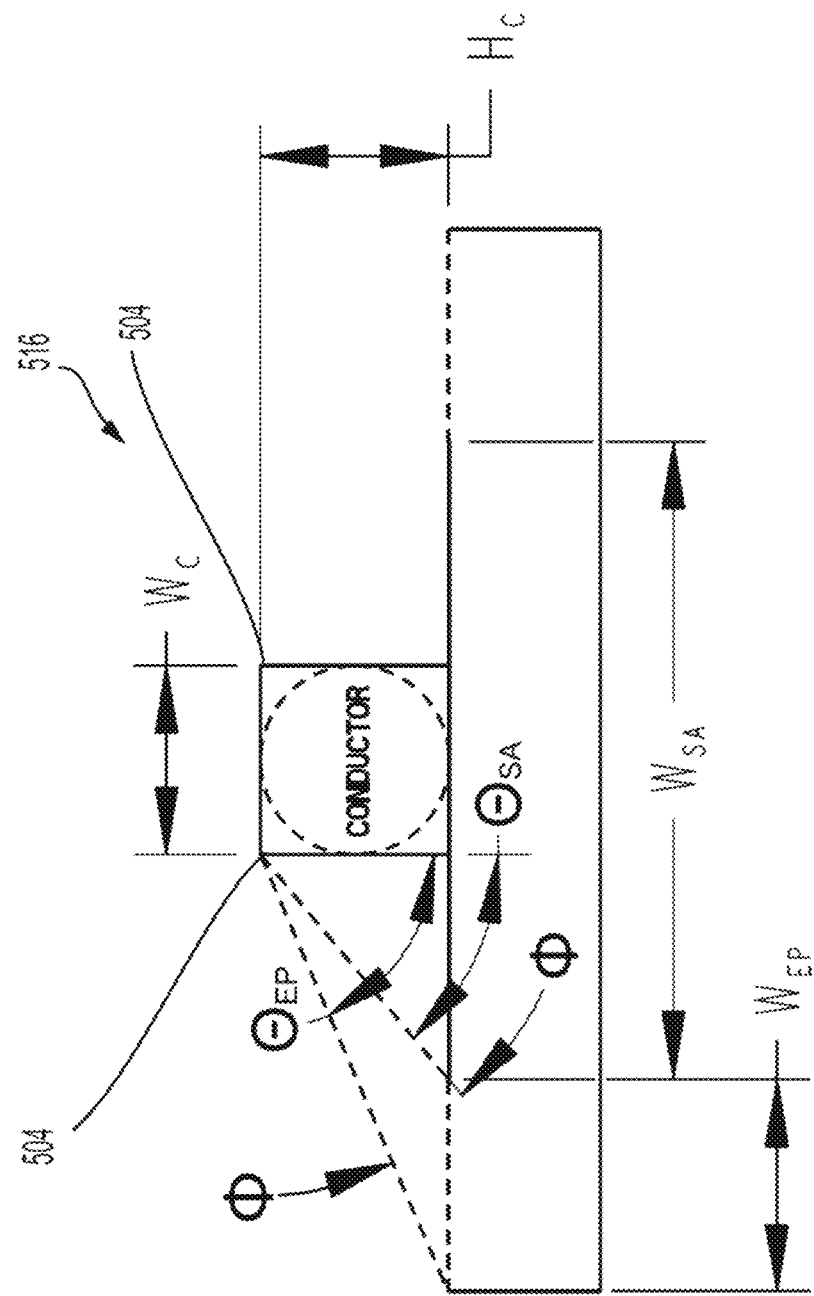
FIG. 10 shows an overhead, plan view of a solder contact area and illustrates a methodology in determining the size of the solder pad extending beneath a solder mask.

Referring now to FIG. 10, a solder contact area 504 of a solder pad 516 is shown in plan view. The width $W_{sa}$ of the solder pad 516 is normally determined by the size of the conductor 516 that will potentially be soldered onto the given solder pad 516. However, an unproved and safer connection is made by selecting the size of the solder pad 516 based on how the manufacturing process of laser soldering can allow heat to be focused outside the solder contact area 504.

For example, the height and width of the solder contact area 504, $H_c$ and $W_c$, can be referenced to determine minimum angle of reflection, $\theta_{sa}$, that would account for a laser in a laser soldering process reflecting outside of the solder contact area 504. A supplemental angle, $\phi$, accounting for part tolerances, conductor placement and variations of the laser soldering process, can thereafter be added to $\theta_{sa}$, to calculate a maximum angle of reflection, $\theta_{ep}$. In this example, the angle, $\phi$, normally ranges between 5 degrees and 30 degrees. The maximum angle of reflection, $\theta_{ep}$, can thereafter be used to calculate the size of the solder pad extension, $W_{ep}$ based on the equation mentioned below.

$$W_{ep} = H_c * \tan\{\theta_{sa} + \phi\} - \frac{W_{sa}}{2} + \frac{W_c}{2}$$

$$5 < \phi < 30 \text{ degrees}$$

Further, the conductor shape for aforementioned calculation could be square, rectangular, or a round shape approximated as square. Other commercially available conductor shapes, of which may contain rounded edges, can be used in the aforementioned calculation given their approximate width and height.

As an aside, several factors contribute to achieving good quality solder connections while preserving the layered electric structure of a printed circuit board, including the thermal properties of the solder process and assembly technique. These factors may include the width of the copper exposed by the solder mask material (not distinctly shown), or the diameter and morphology of the wire to be soldered. As an example, thicker wire requires more heat and solder to make a strong connection. Similarly, wire comprised of a single conductor or multiple strands influences the process. Furthermore, the amount of solder or solder paste required will depend on the size of the solder contact area and the characteristics of the wire. All of these factors will determine the amount of heat required to melt the solder and form a strong electrical connection.

It will be appreciated by those of ordinary skill in the pertinent art that the functions of several elements can, in alternative embodiments, be carried out by fewer elements, or a single element. Similarly, in some embodiments, any functional element can perform fewer, or different, operations than those described with respect to the illustrated embodiment. Also, functional elements shown as distinct for purposes of illustration can be incorporated within other functional elements in a particular embodiment.

While the subject technology has been described with respect to various embodiments, those skilled in the art will readily appreciate that various changes and/or modifications can be made to the subject technology without departing from the scope of the present disclosure.

What is claimed is:
1. A printed circuit board comprising:
an electrically insulative layer;

a conductive solder pad disposed at least partially over the electrically insulative layer, the conductive solder pad defining a solder contact area configured for making an electrical connection to an electrical component by virtue of laser soldering; and a solder mask coating the conductive solder pad and defining an exposed area of the conductive solder pad, wherein the conductive solder pad extends a length underneath the solder mask along a periphery of the exposed area, the length of extension dependent on an angle of reflection outside of the solder contact area during laser soldering.

2. The printed circuit board of claim 1, wherein the length of extension of the conductive solder pad is dependent on a height and width of the solder contact area.

3. The printed circuit board of claim 1, wherein the angle of reflection outside of the solder contact area during laser soldering is a minimum angle of reflection.

4. The printed circuit board of claim 1, wherein the angle of reflection outside of the solder contact area during laser soldering is a maximum angle of reflection, comprising a minimum angle of reflection and a supplemental angle of reflection accounting for part tolerances, conductor placement and/or variations during laser soldering.

5. The printed circuit board of claim 4, wherein the supplemental angle of reflection accounting for part tolerances, conductor placement and/or variations during laser soldering ranges between 5 to 30 degrees.

6. The printed circuit board of claim 1, wherein the length of extension of the conductive solder pad is determined by the following equation:

$$W_{ep} = H_c * \tan\{\theta_{sa} + \phi\} - \frac{W_{sa}}{2} + \frac{W_c}{2}$$

wherein:
$W_{ep}$ is the length of extension of the conductive solder pad;
$H_c$ and $W_c$ are a height and width, respectively, of the solder contact area of the conductive solder pad;
$\theta_{sa}$ is a minimum angle of reflection, accounting for laser reflection outside of the solder contact area during laser soldering;
$\phi$ a supplemental angle of reflection accounting for part tolerances, conductor placement and/or variations during laser soldering; and
$W_{sa}$ is a width of the conductive solder pad.

7. The printed circuit board of claim 6, wherein $\phi$ is between 5 and 30 degrees.

8. The printed circuit board of claim 1, wherein the conductive solder pad is fully disposed around the periphery of the solder contact area, providing heat protection in all directions relative to the solder contact area, less a channel in the printed circuit board for receiving a conductive wire.

9. The printed circuit board of claim 1, wherein the length of extension of the conductive solder pad is 0.25-2.5 millimeters.

10. A printed circuit board comprising:
an insulative layer;
a copper pad disposed over the insulative layer, the copper pad defining a solder contact area for soldering components thereto; and
a solder mask layer disposed over the copper pad, wherein the copper pad extends underneath the solder mask layer to protect the insulative layer during soldering, the length of extension dependent on an angle of reflection outside of the solder contact area during laser soldering.

11. The printed circuit board of claim 10, wherein the length of extension of the copper pad is dependent on a height and width of the solder contact area.

12. The printed circuit board of claim 10, wherein the angle of reflection outside of the solder contact area during laser soldering is a minimum angle of reflection.

13. The printed circuit board of claim 10, wherein the angle of reflection outside of the solder contact area during laser soldering is a maximum angle of reflection, comprising a minimum angle of reflection and a supplemental angle of reflection accounting for part tolerances, conductor placement and/or variations during soldering.

14. The printed circuit board of claim 13, wherein the supplemental angle of reflection accounting for part tolerances, conductor placement and/or variations during soldering ranges between 5 to 30 degrees.

15. The printed circuit board of claim 10, wherein the length of extension of the copper pad is determined by the following equation:

$$W_{ep} = H_c * \tan\{\theta_{sa} + \phi\} - \frac{W_{sa}}{2} + \frac{W_c}{2}$$

wherein:
$W_{ep}$ is the length of extension of the copper pad;
$H_c$ and $W_c$ are a height and width, respectively, of the solder contact area of the copper pad;
$\theta_{sa}$ is a minimum angle of reflection, accounting for light reflection outside of the solder contact area during soldering;
$\phi$ is a supplemental angle of reflection accounting for part tolerances, conductor placement and/or variations during soldering; and
$W_{sa}$ is a width of the copper pad.

16. The printed circuit board of claim 15, wherein $\phi$ is between 5 and 30 degrees.

17. The printed circuit board of claim 10, wherein the copper pad extends underneath the solder mask layer by 0.25-2.5 millimeters.

18. The printed circuit board of claim 10, wherein the copper pad extends underneath the solder mask layer along a periphery of the solder contact area.

19. The printed circuit board of claim 10, wherein the copper pad extends underneath the solder mask layer along a periphery of the solder contact area, less a channel in the printed circuit board for receiving a conductive wire.

20. A method of creating a connection on a printed circuit board, the printed circuit board including an electrically insulating base layer, the method comprising the steps of:
installing a solder pad adjacent the electrically insulating base layer, the solder pad defining an electrical contact area;
coating the solder pad with a solder mask, the solder pad extending beyond the electrical contact area and underneath the solder mask to create a peripheral extension, a size of the peripheral extension dependent on an angle of reflection outside of the electrical contact area during laser soldering, the electrical contact area remaining exposed; and
laser soldering conductive wire to the electrical contact area with a laser so that as light from the laser is reflected from the electrical contact area, the reflected light hits the peripheral extension instead of the electrically insulating base layer and, thereby, the electrically insulating base layer is protected from damage incurred during laser soldering.

* * * * *